United States Patent
Zhang et al.

(10) Patent No.: US 9,158,347 B2
(45) Date of Patent: Oct. 13, 2015

(54) MOUNTING APPARATUS FOR HARD DISK DRIVE AND ELECTRONIC DEVICE WITH THE MOUNTING APPARATUS

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventors: Guang-Yi Zhang, Shenzhen (CN); Gui-Dong Song, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 207 days.

(21) Appl. No.: 13/974,021

(22) Filed: Aug. 22, 2013

(65) Prior Publication Data

US 2015/0043153 A1 Feb. 12, 2015

(30) Foreign Application Priority Data

Aug. 12, 2013 (CN) .......................... 2013 1 03482980

(51) Int. Cl.
| | | |
|---|---|---|
| *G06F 1/16* | (2006.01) | |
| *G06F 1/18* | (2006.01) | |
| *H05K 7/14* | (2006.01) | |

(52) U.S. Cl.
CPC .............. *G06F 1/187* (2013.01); *H05K 7/1401* (2013.01)

(58) Field of Classification Search
CPC ........................................................ G06F 1/187

USPC ................................................... 361/679.33
See application file for complete search history.

(56) References Cited

U.S. PATENT DOCUMENTS

| | | | | |
|---|---|---|---|---|
| 4,258,967 | A * | 3/1981 | Boudreau ..................... 312/322 |
| 6,616,106 | B1 * | 9/2003 | Dean et al. .................... 248/27.1 |
| 7,782,606 | B2 * | 8/2010 | Baker et al. .............. 361/679.39 |
| 2004/0075978 | A1 * | 4/2004 | Chen et al. .................... 361/685 |
| 2005/0185373 | A1 * | 8/2005 | Chen et al. .................... 361/685 |
| 2005/0190535 | A1 * | 9/2005 | Peng et al. .................... 361/685 |
| 2005/0243507 | A1 * | 11/2005 | Lambert et al. ............... 361/685 |
| 2006/0227502 | A1 * | 10/2006 | Cheng ........................... 361/685 |
| 2007/0019377 | A1 * | 1/2007 | Chen et al. .................... 361/685 |
| 2007/0064385 | A1 * | 3/2007 | Paul et al. ..................... 361/687 |
| 2008/0030946 | A1 * | 2/2008 | Lee ............................... 361/685 |
| 2008/0204994 | A1 * | 8/2008 | Wang ............................ 361/685 |
| 2008/0259554 | A1 * | 10/2008 | Qin et al. ....................... 361/685 |
| 2009/0279249 | A1 * | 11/2009 | Crippen et al. .......... 361/679.58 |
| 2010/0309621 | A1 * | 12/2010 | Chang et al. ............. 361/679.39 |
| 2010/0321879 | A1 * | 12/2010 | Peng et al. ............... 361/679.33 |
| 2011/0304960 | A1 * | 12/2011 | Lu ............................ 361/679.01 |
| 2015/0043152 | A1 * | 2/2015 | Zhang et al. ............ 361/679.37 |

* cited by examiner

*Primary Examiner* — Adrian S Wilson
(74) *Attorney, Agent, or Firm* — Novak Druce Connolly Bove + Quigg LLP

(57) ABSTRACT

A mounting apparatus for a hard disk drive (HDD) which does not require screw fixings includes a bracket defining a first locating hole and a carrier. The HDD includes a pin. The carrier includes a shell receiving the HDD, a resilient connecting member, an unlocking member installed on a side of the shell, and an operating assembly. The unlocking member includes a resilient abutting plate. The operation member includes a connecting rack with rotating latching member mounted to a front end of the shell. A front end of the connecting member is mounted to the shell, a rear end of the connecting member is detachably connected the bracket. The abutting plate abuts against the pin. A block of the latching member latches in the first locating hole, and a second end of the latching member is detachably latched to the connecting rack.

19 Claims, 8 Drawing Sheets

MOUNTING APPARATUS FOR HARD DISK DRIVE AND ELECTRONIC DEVICE WITH THE MOUNTING APPARATUS

BACKGROUND

1. Technical Field

The present disclosure relates to electronic devices, and more particularly, to an electronic device with a mounting apparatus for mounting a hard disk drive (HDD).

2. Description of Related Art

The HDDs of computers are mounted in a bracket of the computer. The HDD is directly inserted into the bracket, and a large number of screws extend through sidewalls of the bracket to fix the HDD to the bracket. However, the mounting or removal of the HDD to or from the bracket requires a tool to fasten or release the screws. Thus, the assembly and disassembly of the HDD are not only time-consuming but also laborious.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references mean "at least one."

Figure 1:
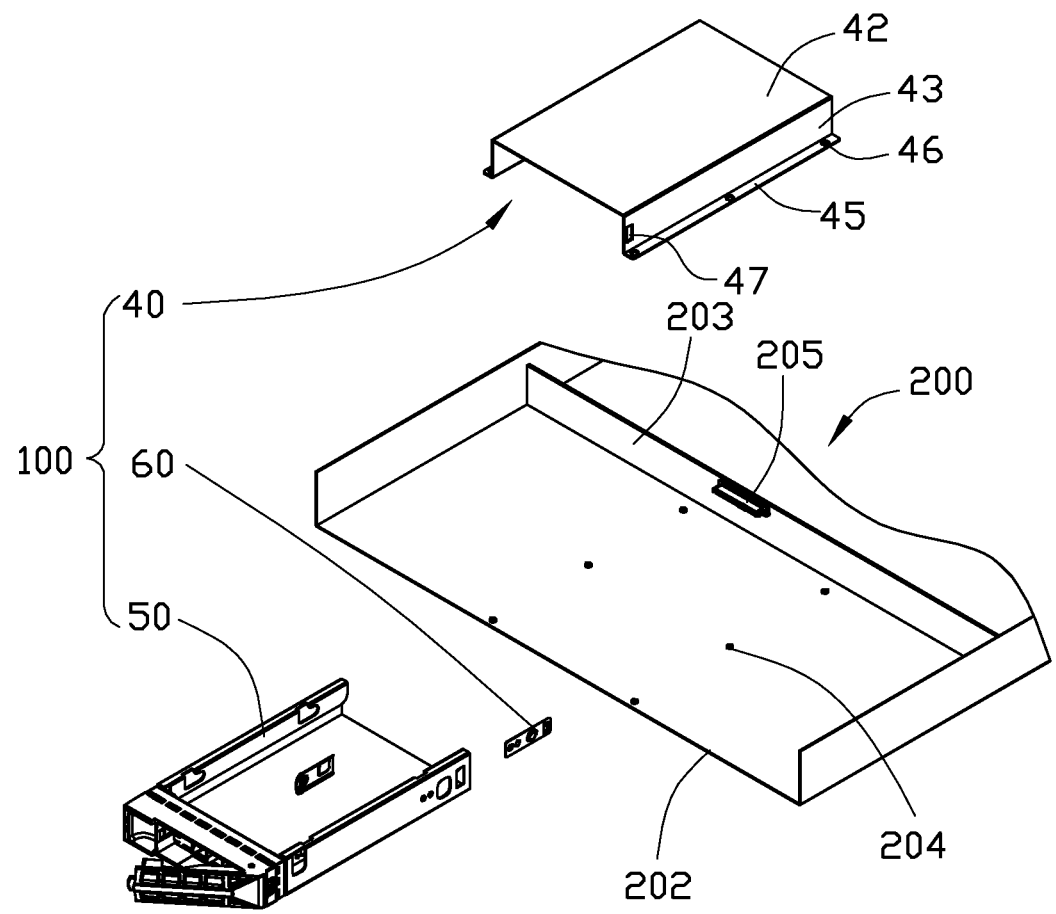
FIG. 1 is an exploded view of an exemplary embodiment of an electronic device, wherein the electronic device includes a carrier and a connecting member.
Figure 6:
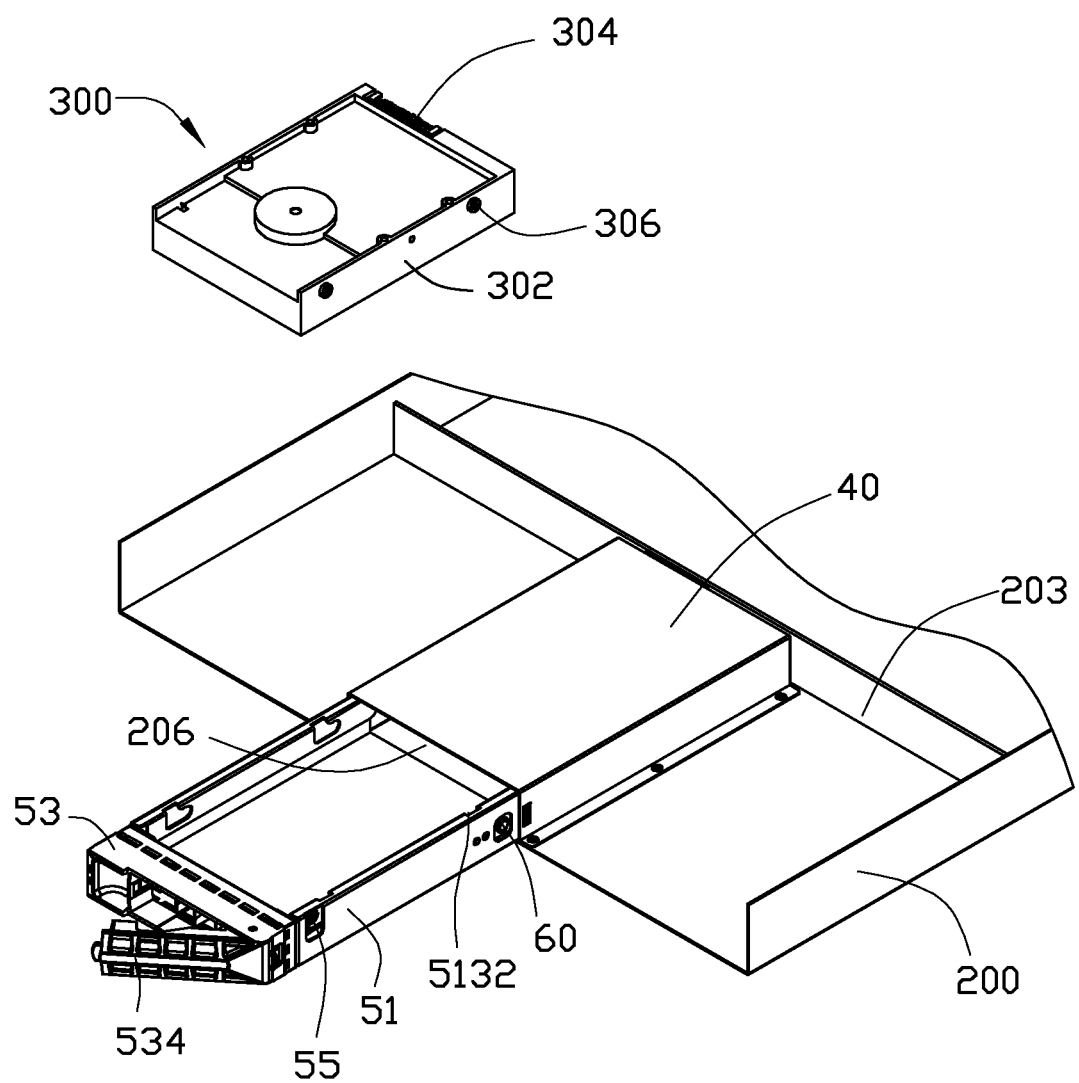
FIGS. 6-8 are views showing the processes of assembling a hard disk drive into the electronic device of FIG. 1.

FIGS. 1 and 6 show an exemplary embodiment of an electronic device including a chassis 200, a hard disk drive (HDD) 300, and a mounting apparatus 100 for mounting the HDD 300 in the chassis 200. The mounting apparatus 100 includes a bracket 40, a carrier 50, and a connecting member 60.

The chassis 200 includes a bottom wall 202 and a circuit board 203 perpendicularly mounted on a middle portion of the bottom wall 202. The bottom wall 202 defines a plurality of screw holes 204 in front of the circuit board 203. A first connector 205 is mounted on a front side of the circuit board 203 facing the screw holes 204.

The HDD 300 includes two opposite sidewalls 302 and a second connector 304 mounted to a rear end of the HDD 300. Two spaced pins 306 are mounted on two opposite ends of each sidewall 302. In the embodiment, each pin 306 is a screw.

The bracket 40 includes a rectangular top plate 42, two opposite side plates 43 perpendicularly extending down from opposite sides of the top plate 42, and two flanges 45 protruding out from bottom sides of the side plates 43. Each flange 45 defines a plurality of through holes 46. A front end of one of the side plates 43 defines a first locating hole 47.

Figure 2:
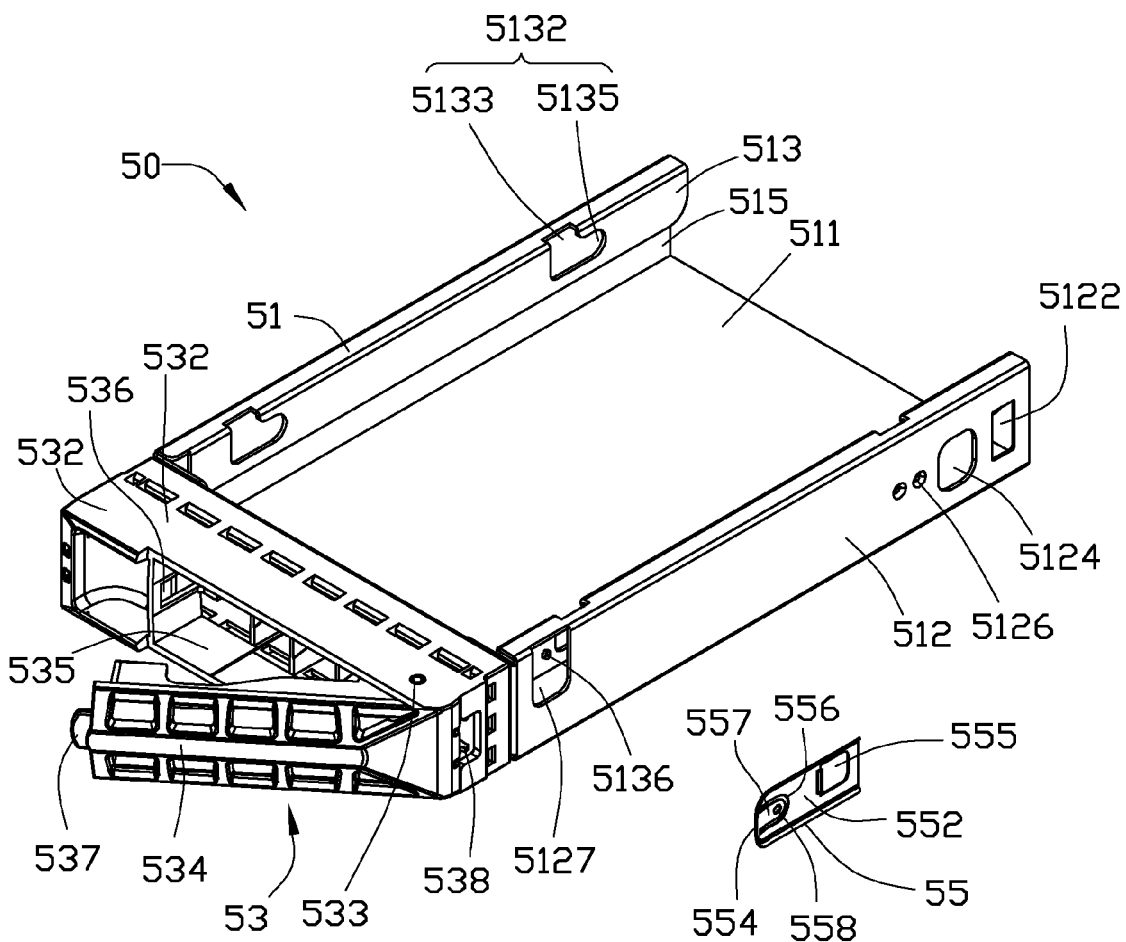
FIG. 2 is an enlarged view of the carrier of FIG. 1.

FIG. 2 shows the carrier 50 including a shell 51, an operating assembly 53 mounted on a front end of the shell 51, and a resilient unlocking member 55.

The shell 51 includes a rectangular base plate 511, two opposite supporting plates 512 perpendicularly extending up from opposite sides of the base plate 511, and two substantially L-shaped position plates 513 extending in and then extending down from top sides of the supporting plates 512. The supporting plates 512 and the position plates 513 cooperatively bound two receiving slots 515. A rear end of one of the supporting plates 512 defines a second locating hole 5122, two fastening holes 5126 located in front of the second locating hole 5122, and a through hole 5124 located between the second locating hole 5122 and the fastening holes 5126. A front end of the supporting plate 512 which has the second locating hole 5122 defines an operation hole 5127 opposite to the second locating hole 5122. Front and rear ends of each position plate 513 define two installing holes 5132. Each installing hole 5132 is substantially L-shaped, and includes an access portion 5133 extending down from a top of the position plate 513, and a receiving portion 5135 extending rearward from a bottom end of the access portion 5133. The operation hole 5127 is located adjacent to the installing hole 5132. A latching pole 5136 protrudes from the position plate 513 toward the operation hole 5127.

The operating assembly 53 includes a connecting rack 532 mounted on the front end of the shell 51 and a latching member 534. A front side of the connecting rack 532 defines a receiving space 535 for receiving the latching member 534. A first end of the latching member 534 is rotatably connected to a first end of the connecting rack 532 through a shaft 533, and a resilient hook 537 protrudes from a second end of the latching member 534 opposite to the shaft 533. A block 538 protrudes from the first end of the latching member 534 opposite to the hook 537. A second end of the connecting rack 532 opposite to the shaft 533 defines a latching hole 536 communicating with the receiving space 535. The hook 537 can be detachably latched in the latching hole 536 of the connecting rack 532. If the hook 537 is latched in the latching hole 536, the block 538 is exposed out from the first end of the connecting rack 532.

The unlocking member 55 is made of resilient material, and includes a substantially rectangular abutting plate 552 and an operation plate 554 slantingly extending out from a front end of the abutting plate 552. A rear end of the abutting plate 552 defines a position hole 555 opposite to the operation plate 554. A junction of the operation plate 554 and the abutting plate 552 defines a rectangular through hole 556. A resilient tongue 557 extends into the through hole 556 from an end wall bounding the through hole 556 adjacent to the operation plate 554. A distal end of the tongue 557 defines a mounting hole 558.

Figure 3:
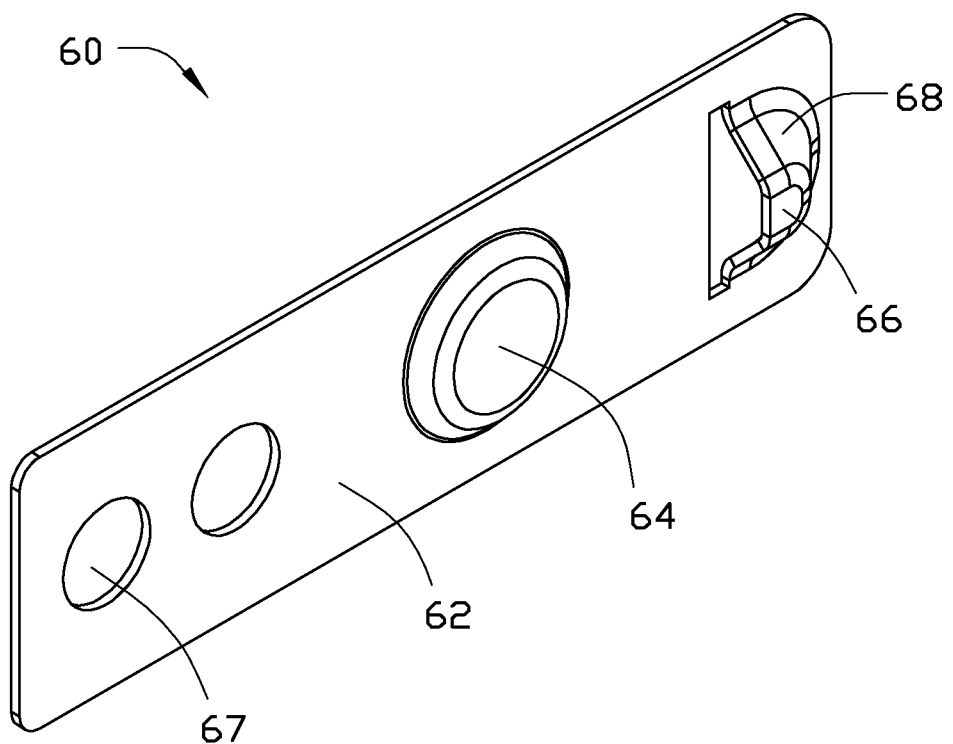
FIG. 3 is an enlarged view of the connecting member of FIG. 1.

FIG. 3 shows the connecting member 60 which is made of a resilient material, and which includes a substantially rectangular connecting plate 62, an operation portion 64 protruding out from a middle of the connecting plate 62, and a wedge-shaped abutting block 66 protruding out from a rear end of the connecting plate 62. A front end of the connecting plate 62 defines two through holes 67. The abutting block 66 defines a slanting guiding surface 68 opposite to the operation portion 64.

Figure 4:
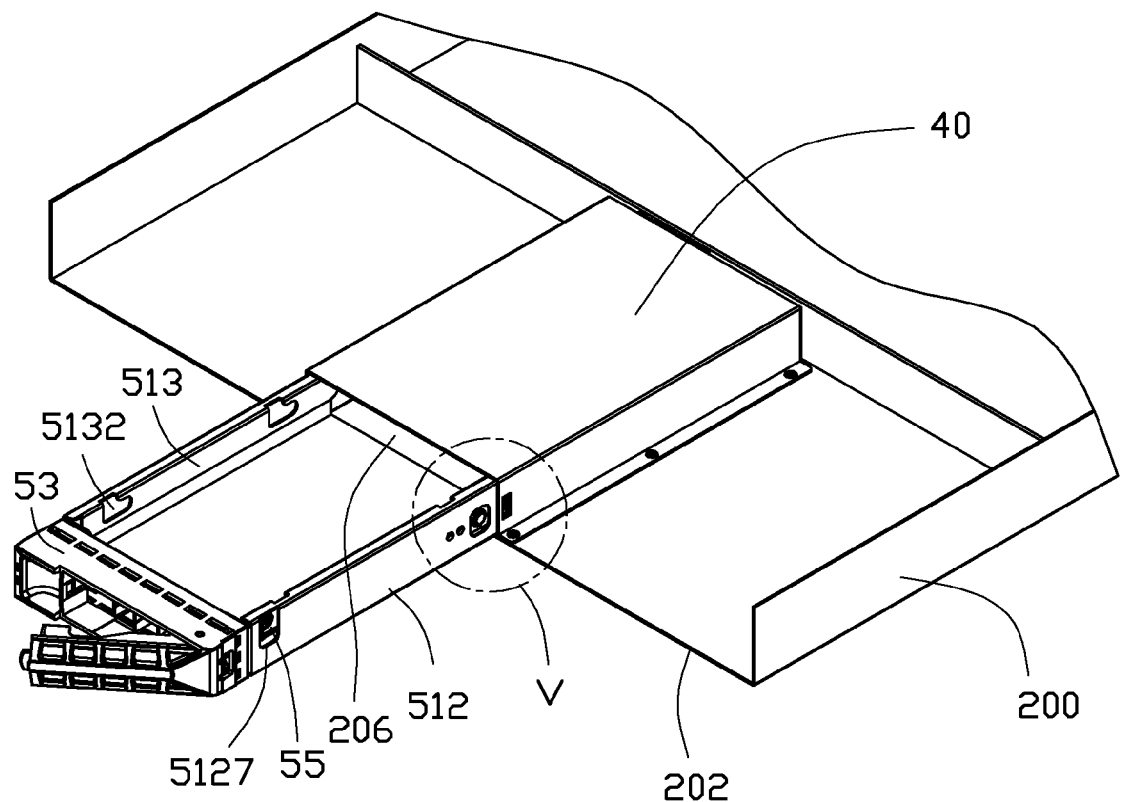
FIG. 4 is an assembled view of the electronic device of FIG. 1.
Figure 5:
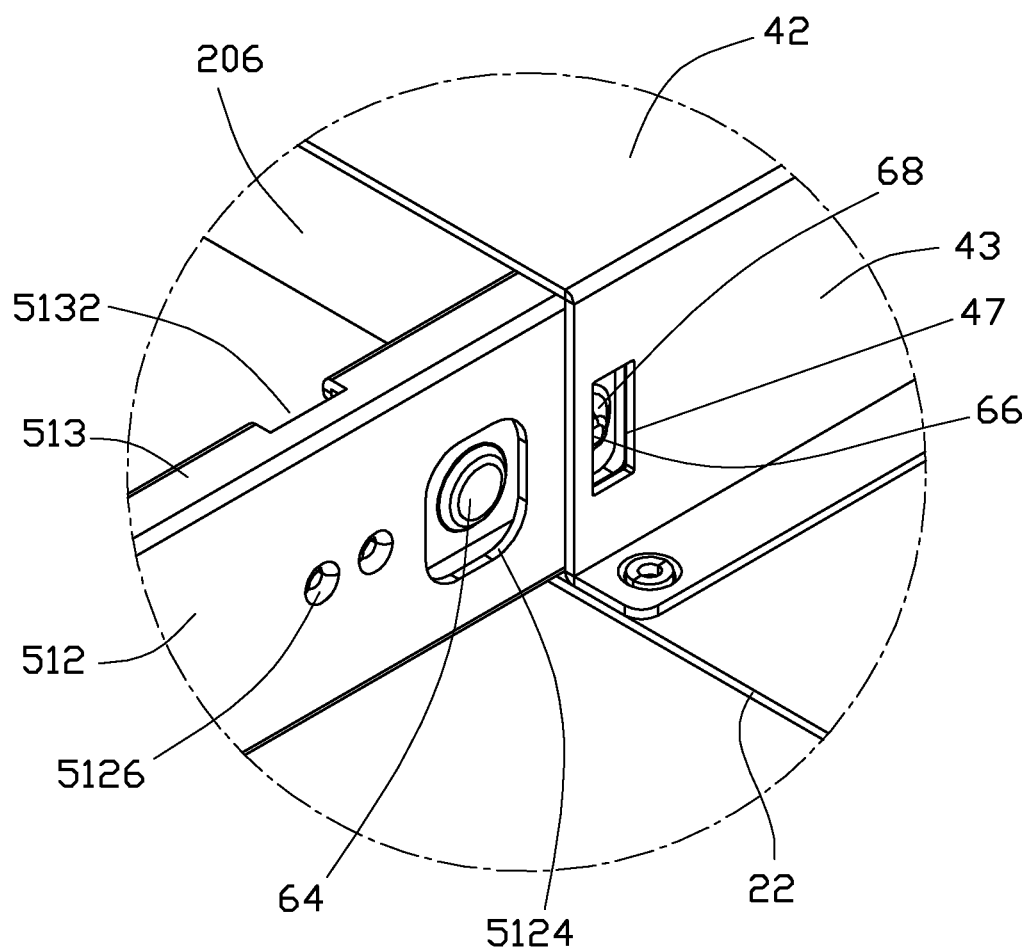
FIG. 5 is an enlarged view of the circled portion V of FIG. 4.

FIGS. 4 and 5 show that, in assembly, the bracket 40 is supported on the bottom wall 202 of the chassis 200. The through holes 46 of the bracket 40 align with the screw holes 204 of the bottom wall 202. A plurality of screws extends through the through holes 46, to be screwed into the screw holes 204. The bracket 40 and the chassis 200 cooperatively bound an installing space 206. The unlocking member 55 is sandwiched between the supporting plate 512 with the operation hole 517 and the position plate 513, to allow the operation plate 554 of the unlocking member 55 to be received in the operation hole 5127. The latching pole 5136 is latched in the mounting hole 558, and the unlocking member 55 is thus mounted to the shell 51. The position hole 555 of the unlocking member 55 aligns with the receiving portion 5135 of the installing hole 5132. The front end of the connecting member 60 is inserted into the receiving slot 515 which communicates with the through hole 5124, with the operation portion 64 being received in the through hole 5124. The abutting block 66 extends through the second locating hole 5122 and is exposed out of the plate 512. The through holes 67 align with the fastening holes 5126. Two screws extend through the through holes 67, to be screwed into the fastening holes 5126. The carrier 50 and the connecting member 60, as a unit, are placed on a front end of the bracket 40, with the connecting member 60 adjacent to the first locating hole 47. The rear end of the carrier 50 is inserted in the installing space 206. The guiding surface 68 of the abutting block 66 slidably abuts against the slide plate 43, deforming the plate 62, until the abutting block 66 aligns with the first locating hole 47. The connecting plate 62 restores to bias the abutting block 66 to being latched in the first locating hole 47. Thereby, the mounting apparatus 100 is mounted to the chassis 200, and the carrier 50 is exposed out of the bracket 40.

Figure 7:
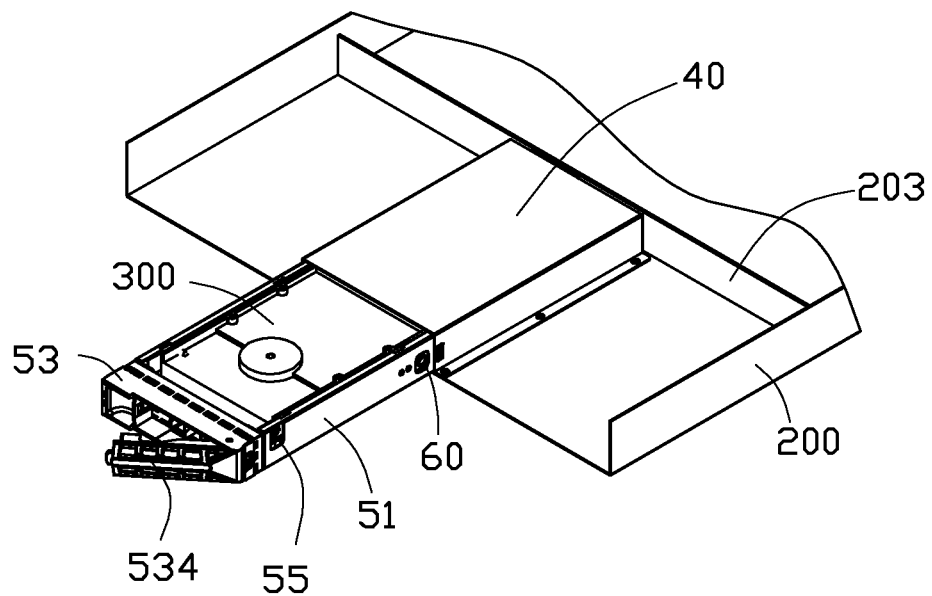
Figure 8:
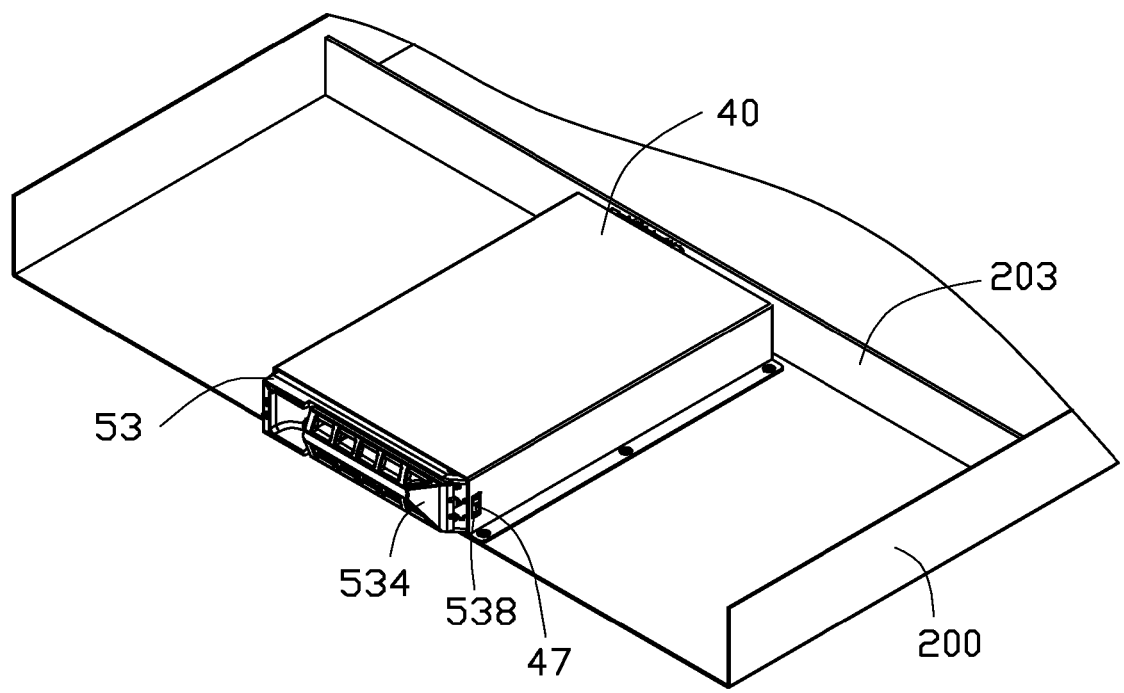

FIGS. 6-8 show that, in use, the HDD 300 is placed into the shell 51, with the pins 306 aligning with the installing holes 5132. The HDD 300 is moved downward and then rearward. Each pin 306 is received in the receiving portion 5135 through the access portion 5133. Thus, the HDD 300 is supported on the base plate 511. In the above-mentioned processes of assembling the HDD 300, one of the pins 306 slidably abuts against the abutting plate 552, deforming the abutting plate 552, until the pin 306 is latched in the position hole 555 of the unlocking member 55. The abutting plate 552 restores to abut against the pin 306. The latching member 534 is rotated away from the receiving space 535, until the block 538 is received in the connecting rack 532. The combined carrier 50 and connecting member 60 are pushed to the rear toward the installing space 206, and the guiding surfaces 68 of the connecting member 60 slidably abut against inner walls bounding the first locating hole 47, thus deforming the connecting plate 62. The abutting block 66 is detached from the first locating hole 47, and received in the second locating hole 5122. The carrier 50 is received in the installing space 206, and the second connector 304 of the HDD 300 is electrically coupled to the first connector 205 of the circuit board 203. The latching member 534 is rotated toward the receiving space 535. The block 538 is latched into the first locating hole 47, and the hook 537 is latched in the latching hole 536 of the connecting rack 532.

To detach the HDD 300 from the mounting apparatus 100, the hook 537 is deformed, until the hook 537 is detached from the latching hole 536. The latching member 534 is rotated away from the receiving space 535, until the block 538 is detached from the first locating hole 47. The carrier 50 is pulled out from the installing space 206. The second connector 304 is detached from the first connector 205. Thus, the carrier 50 can be moved out to extend from the bracket 42.

The operation plate 554 is pressed through the operation pole 5127, deforming the abutting plate 552, until the abutting plate 552 is detached from the pin 306. Thereby, the HDD 300 can be moved upward and detached from the carrier 50.

To detach the carrier 50 and the connecting member 60 as a unit from the chassis 200, the operation portion 64 is pressed inward through the through hole 5124 of the shell 51, deforming the connecting plate 62, until the abutting block 66 is detached from the first locating hole 47 of the bracket 40. Thereby, the combined carrier 50 and connecting member 60 can be detached from the bracket 40.

Even though numerous characteristics and advantages of the embodiments have been set forth in the foregoing description, together with details of the structure and function of the embodiments, the present disclosure is illustrative only, and changes may be made in detail, especially in the matters of shape, size, and arrangement of parts within the principles of the embodiments to the full extent indicated by the broad general meaning of the terms in which the appended claims are expressed.

What is claimed is:

1. A mounting apparatus for a hard disk drive having two opposite sidewalls and a pin extending out from one of the sidewalls, the mounting apparatus comprising:
    a bracket defining a first locating hole; and
    a carrier detachably received in the bracket, and comprising:
        a shell for receiving the hard disk drive;
        a resilient connecting member;
        a resilient unlocking member installed on a side of the shell, and comprising an abutting plate; and
        an operating assembly comprising a connecting rack mounted to a front end of the shell and a latching member rotatably connected to the connecting rack;
    wherein the shell defines an installing hole adjacent to the unlocking member, a front end of the connecting member is mounted to the shell, and a rear end of the connecting member is detachably connected in the first locating hole of the bracket, a rear end of the shell is connected to the bracket, the abutting plate of the unlocking member abuts against the pin received in the installing hole, the carrier is pushed in the bracket, a block protrudes out from a first end of the latching member to latch in the first locating hole, and a second end of the latching member is detachably latched to the connecting rack.

2. The mounting apparatus of claim 1, wherein the bracket comprises a top plate, two opposite side plates extending down from two sides of the top plate, the top plate and the side plates cooperatively bound an installing space for receiving the carrier, the first locating hole is defined in a front end of one of the side plates.

3. The mounting apparatus of claim 1, wherein the shell comprises a supporting plate and a position plate extending in from a top side of the supporting plate, the unlocking member is installed between the supporting plate and the position plate, the installing hole is defined in the position plate.

4. The mounting apparatus of claim 3, wherein the installing hole comprises an access portion extending down from a top of the position plate and a receiving portion extending rearward from a bottom end of the access portion, the abutting plate of the unlocking member defines a position hole aligning with the receiving portion, the pin of the hard disk drive is inserted in the installing hole, the pin slidably abuts against the abutting plate, deforming the abutting plate, until the pin is received in the position hole, the abutting plate is restored to abut against the pin.

5. The mounting apparatus of claim 3, wherein a rear end of the supporting plate defines a second locating hole, the connecting member comprises a resilient connecting plate mounted between the supporting plate and the position plate, and an abutting block protruding out from the connecting plate, the abutting block extends through the second locating hole of the shell, to be detachably latched in the first locating hole of the bracket.

6. The mounting apparatus of claim 5, wherein the supporting plate defines a through hole adjacent to the second locating hole, the connecting member further comprises an operation portion protruding out from the connecting plate and received in the through hole, the operation portion is pressed through the through hole, deforming the connecting plate, the abutting block is detached from the first locating hole of the bracket.

7. The mounting apparatus of claim 6, wherein the abutting block defines a guiding surface opposite to the operation portion.

8. The mounting apparatus of claim 3, wherein the supporting plate defines an operation hole adjacent to the installing hole, the unlocking member further comprises an operation plate slantingly extending from the abutting plate toward the operation hole, the operation plate is pressed through the operation hole, deforming the abutting plate, the abutting plate is detached from the pin.

9. The mounting apparatus of claim 8, wherein a latching pole protrudes from the position plate toward the operation hole, a resilient tongue extends from the unlocking member, a distal end of the tongue defines a mounting hole, the latching pole is latched in the mounting hole of the tongue.

10. An electronic device, comprising:
a chassis;
a hard disk drive comprising a side wall and a pin extending out from the side wall; and
a mounting apparatus comprising:
a bracket mounted in the chassis; and
a carrier slidably received in the bracket, and the carrier comprising:
a shell receiving the hard disk drive;
a resilient connecting member mounted to the shell;
a resilient unlocking member installed on a side of the shell and comprising an abutting plate; and
an operating assembly comprising a connecting rack mounted to a front end of the shell and a latching member rotatably connected to the connecting rack;
wherein the shell defines an installing hole adjacent to the unlocking member for receiving the pin of the hard disk drive, a front end of the bracket defines a first locating hole, a front end of the connecting member is mounted to the shell, and a rear end of the connecting member is detachably latched to the first locating hole, the abutting plate abuts against the pin received in the installing hole, when the shell is received in the bracket; wherein a block protrudes out from a first end of the latching member to latch in the first locating hole, and a second end of the latching member is detachably latched to the connecting rack.

11. The electronic device of claim 10, wherein the bracket comprises a top plate, two opposite side plates extending down from two sides of the top plate, the side plates are mounted in the chassis, the top plate, the side plates, and the chassis cooperatively bound an installing space for receiving the carrier, the first locating hole is defined in a front end of one of the side plates.

12. The electronic device of claim 10, wherein the shell comprises a supporting plate and a position plate extending in from a top side of the supporting plate, the unlocking member is installed between the supporting plate and the position plate, the installing hole is defined in the position plate.

13. The electronic device of claim 12, wherein the installing hole comprises an access portion extending down from a top of the position plate and a receiving portion extending rearward from a bottom end of the access portion, the abutting plate of the unlocking member defines a position hole aligning with the receiving portion, the pin of the hard disk drive is inserted in the receiving portion through the access portion, the pin slidably abuts against the abutting plate, deforming the abutting plate, until the pin is received in the position hole, the abutting plate is restored to abut against the pin.

14. The electronic device of claim 12, wherein a rear end of the supporting plate defines a second locating hole, the connecting member comprises a resilient connecting plate mounted to the supporting plate, and an abutting block protruding out from the connecting plate, the abutting block extends through the second locating hole of the shell, to be detachably latched in the first locating hole of the bracket.

15. The electronic device of claim 14, wherein the supporting plate defines a through hole adjacent to the second locating hole, the connecting member further comprises an operation portion protruding out from the connecting plate and received in the through hole, the operation portion is pressed through the through hole, deforming the connecting plate, the abutting block is detached from the first locating hole of the bracket.

16. The electronic device of claim 15, wherein the abutting block defines a guiding surface opposite to the operation portion.

17. The electronic device of claim 12, wherein the supporting plate defines an operation hole adjacent to the installing hole, the unlocking member further comprises an operation plate slantingly extending from the abutting plate toward the operation hole, the operation plate is pressed through the operation hole, deforming the abutting plate, the abutting plate is detached from the pin.

18. The electronic device of claim 17, wherein a latching pole protrudes from the position plate toward the operation hole, a resilient tongue extends from the unlocking member, a distal end of the tongue defines a mounting hole, the latching pole is latched in the mounting hole of the tongue.

19. The electronic device of claim 11, wherein the chassis comprises a circuit board having a first connector aligning with the installing space, the hard disk drive further comprises a second connector detachably and electrically coupled to the first connector of the circuit board.

* * * * *